(12) United States Patent  
Kajihara

(10) Patent No.: US 9,017,484 B2
(45) Date of Patent: Apr. 28, 2015

(54) SUSCEPTOR

(71) Applicant: NGK Insulators, Ltd., Nagoya (JP)

(72) Inventor: Noboru Kajihara, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/263,236

(22) Filed: Apr. 28, 2014

(65) Prior Publication Data

US 2014/0231019 A1  Aug. 21, 2014

Related U.S. Application Data

(63) Continuation of application No. PCT/JP2013/079979, filed on Nov. 6, 2013.

(60) Provisional application No. 61/722,900, filed on Nov. 6, 2012.

(51) Int. Cl.
| | | |
|---|---|---|
| *C23C 16/00* | (2006.01) | |
| *C23F 1/00* | (2006.01) | |
| *H01J 37/32* | (2006.01) | |
| *H01L 21/67* | (2006.01) | |
| *H01L 21/683* | (2006.01) | |

(52) U.S. Cl.
CPC ..... *H01J 37/32715* (2013.01); *H01L 21/67103* (2013.01); *H01L 21/6831* (2013.01); *H01J 37/32532* (2013.01); *H01J 37/32091* (2013.01)

(58) Field of Classification Search
CPC ............... H01L 21/6833; H01L 21/6831
See application file for complete search history.

(56) References Cited

U.S. PATENT DOCUMENTS

| | | | | |
|---|---|---|---|---|
| 5,151,845 | A | * | 9/1992 | Watanabe et al. ............. 361/234 |
| 5,646,814 | A | * | 7/1997 | Shamouilian et al. ........ 361/234 |
| 5,688,331 | A | | 11/1997 | Aruga et al. |
| 5,739,069 | A | * | 4/1998 | Usui et al. ..................... 438/710 |
| 6,478,924 | B1 | * | 11/2002 | Shamouilian et al. ... 156/345.48 |

(Continued)

FOREIGN PATENT DOCUMENTS

| | | |
|---|---|---|
| JP | 07-153706 A1 | 6/1995 |
| JP | 08-078193 A1 | 3/1996 |
| JP | 2000-158275 A1 | 6/2000 |

(Continued)

OTHER PUBLICATIONS

International Search Report and Written Opinion (Application No. PCT/JP2013/079979) dated Dec. 10, 2013 (with English translation).

*Primary Examiner* — Gordon R Baldwin
*Assistant Examiner* — Charlee Bennett
(74) *Attorney, Agent, or Firm* — Burr & Brown, PLLC

(57) ABSTRACT

A susceptor includes a ceramic substrate having a wafer-placing surface; a first circular RF electrode buried in the ceramic substrate; and a second circular RF electrode buried in the ceramic substrate at a depth different from the depth of the first RF electrode. The second RF electrode has a larger diameter than the first RF electrode. The second RF electrode has a plurality of holes with an opening area of 9.42 to 25.13 $mm^2$ distributed in a portion overlapping the first RF electrode in a plan view of the ceramic substrate. The electrode width between the holes is 3 to 7 mm.

5 Claims, 9 Drawing Sheets

(56) References Cited

U.S. PATENT DOCUMENTS

| | | |
|---|---|---|
| 7,881,036 B2 * | 2/2011 | Fujisawa et al. ............. 361/234 |
| 8,238,072 B2 * | 8/2012 | Fujisawa et al. ............. 361/234 |
| 2007/0223173 A1 * | 9/2007 | Fujisawa et al. ............. 361/234 |
| 2009/0041980 A1 * | 2/2009 | Miyashita et al. ............. 428/138 |
| 2011/0096461 A1 | 4/2011 | Yoshikawa et al. |

FOREIGN PATENT DOCUMENTS

| | | | |
|---|---|---|---|
| JP | 2002-313899 A1 | | 10/2002 |
| JP | 2003077995 A | * | 3/2003 |
| JP | 2011-119654 A1 | | 6/2011 |
| JP | 2012-089694 A1 | | 5/2012 |
| JP | 2012-182221 A1 | | 9/2012 |

* cited by examiner

SUSCEPTOR

TECHNICAL FIELD

The present invention relates to susceptors.

BACKGROUND ART

There are susceptors known in the related art that include a plurality of RF electrodes buried therein and laminated so as to be spaced apart from each other. For example, a susceptor 110 in PTL 1 shown in FIG. 8 includes a ceramic substrate 120 and a circular RF electrode 131 and an annular RF electrode 132 that are buried therein and laminated so as to be spaced apart from each other. The circular RF electrode 131 is connected to a first lead 138 via a first external terminal 136 disposed near the center of the susceptor 110. The annular RF electrode 132 is connected to a second lead 139 via a second external terminal 137 disposed near the center of the susceptor 110. As shown in FIG. 9, the annular RF electrode 132 and the second external terminal 137 are connected together with connection circuits 134 arranged radially and in rotational symmetry. A cylindrical support member 140 is attached to the center of the back surface of the susceptor 110 and accommodates the first lead 138 and the second lead 139. The support member 140 functions to protect the first lead 138 and the second lead 139 from corrosive environments. PTL 1 discusses that the susceptor 110 can create a uniform potential inside the annular RF electrode 132 to reduce the density variation of the resulting plasma, thus allowing uniform plasma treatment over the entire surface of a wafer placed on the susceptor 110. PTL 1 also discusses that the density distribution of the plasma can be well controlled by applying different radio-frequency electrical powers to the circular RF electrode 131 and the annular RF electrode 132.

CITATION LIST

Patent Literature

PTL 1: JP 2012-89694 A

SUMMARY OF INVENTION

Technical Problem

However, when different plasma environments were created in the center and periphery of a wafer on the susceptor 110 by supplying RF currents with different frequencies to the circular RF electrode 131 and the annular RF electrode 132 to cancel out the thickness distribution of a deposited film or the distribution of etching rate in the center and periphery of the wafer, the following problem occurred. Specifically, in a plan view of the susceptor 110 on which the wafer was placed, the thickness of the film formed on the wafer differed between the portions of the circular RF electrode 131 overlapping the radial connection circuits 134 and the portion of the circular RF electrode 131 not overlapping the radial connection circuits 134. As a result, the spoke pattern of the connection circuits 134 was transferred to the resulting film. This decrease in thickness uniformity is probably due to the difference in plasma properties between the portions of the circular RF electrode 131 overlapping the radial connection circuits 134 and the portion of the circular RF electrode 131 not overlapping the radial connection circuits 134.

In view of the foregoing problem, a primary object of the present invention is to provide uniform plasma properties in the center of a susceptor including a plurality of RF electrodes buried therein and laminated so as to be spaced apart from each other.

Solution to Problem

A susceptor according to the present invention comprises a ceramic substrate having a wafer-placing surface; a first circular RF electrode buried in the ceramic substrate; and a second circular RF electrode buried in the ceramic substrate at a depth different from the depth of the first RF electrode, and having a larger diameter than the first RF electrode, wherein the second RF electrode has a plurality of holes with an opening area of 9.42 to 25.13 mm$^2$ distributed in a portion overlapping the first RF electrode in a plan view of the ceramic substrate, the electrode width between the holes being 3 to 7 mm.

This susceptor can be installed in a semiconductor manufacturing apparatus that uses plasma to provide uniform plasma properties, particularly in the center of the susceptor, thus allowing uniform treatment in the center of the wafer. Unlike the related art, the resulting film has no thickness variation due to transfer of the overlapping portions of the two RF electrodes after deposition. The frequencies and powers of the currents applied to the RF electrodes can be changed to reduce the variation in film thickness or etching depth in the center and periphery of the wafer or to intentionally make the film thickness smaller or the etching depth greater in either region.

In the susceptor according to the present invention, the plurality of holes preferably all have the same opening shape and are regularly arranged. This allows the second RF electrode to be relatively easily fabricated.

In the susceptor according to the present invention, the plurality of holes preferably have a triangular or hexagonal opening shape. This results in less variation in film thickness after deposition than if the holes have a circular opening shape. More preferably, the holes have a hexagonal opening shape.

In the susceptor according to the present invention, the diameter of the first RF electrode in a plan view of the ceramic substrate is preferably within ±10 mm with respect to the diameter of a circular central portion of the second RF electrode in which the plurality of holes are formed. This results in less variation in film thickness after deposition. More preferably, the diameter of the first RF electrode is equal to the diameter of the circular central portion. This results in even less variation in film thickness after deposition.

DETAILED DESCRIPTION OF THE INVENTION

Figure 1:
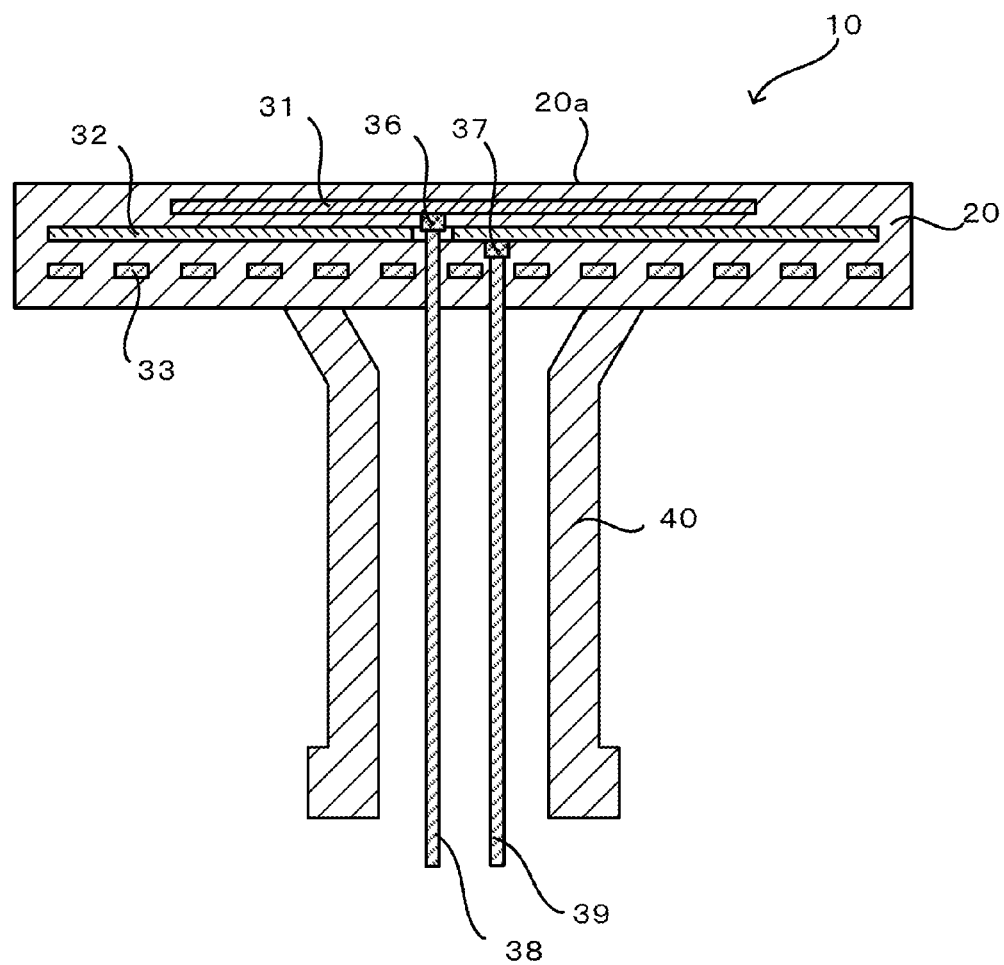
FIG. 1 is a longitudinal sectional view of a susceptor
Figure 2:
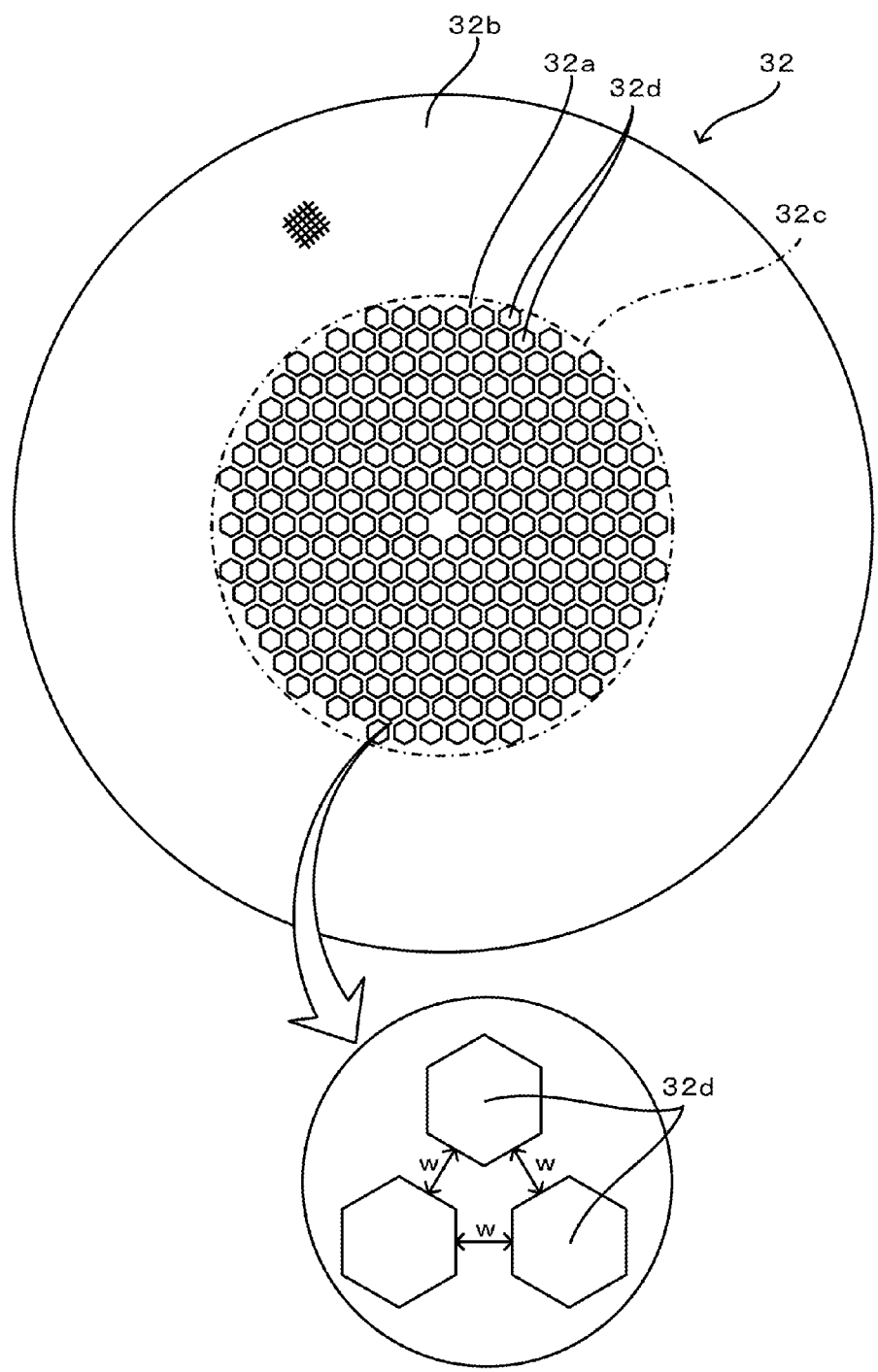
FIG. 2 is a plan view of a second RF electrode 32.

Preferred embodiments of the present invention will now be described with reference to the drawings. FIG. 1 is a longitudinal sectional view of a susceptor 10, and FIG. 2 is a plan view of a second RF electrode 32. The description may contain "upper", "lower", "left", and "right", which are merely used to indicate relative positional relationships; for example, "upper" may be replaced with "lower", and "left" may be replaced with "right".

The susceptor 10 is used, for example, as a component of a semiconductor manufacturing apparatus, such as an electrostatic chuck or a ceramic heater. The susceptor 10 includes a disk-shaped ceramic substrate 20 having a front surface serving as a wafer-placing surface 20a and, in order from the side closer to the wafer-placing surface 20a, a first RF electrode 31, a second RF electrode 32, and a heater electrode 33 that are buried in the ceramic substrate 20. The susceptor 10 also includes a cylindrical shaft 40 joined to the surface (back surface) opposite the wafer-placing surface 20a.

The ceramic substrate 20 is a disk-shaped plate made of a ceramic material such as aluminum nitride or alumina.

The first RF electrode 31 is a circular metal mesh, such as a molybdenum mesh or tungsten mesh. A first power supply rod 38 is connected to the first RF electrode 31 via a first terminal 36. The first power supply rod 38 extends through the second RF electrode 32 without contact therewith, extends through the interior of the shaft 40, and is connected to a first radio-frequency power supply (not shown).

The second RF electrode 32 is buried in the ceramic substrate 20 at a depth different from the depth of the first RF electrode 31. The second RF electrode 32 is a circular metal mesh, such as a molybdenum mesh or tungsten mesh, and has a larger diameter than the first RF electrode 31. As shown in FIG. 2, the second RF electrode 32 has a virtual boundary 32c between a circular central portion 32a and a ring-shaped peripheral portion 32b. The central portion 32a is a portion that overlaps the first RF electrode 31 in a plan view of the ceramic substrate 20. The central portion 32a has a plurality of holes 32d with an opening area of 9.42 to 25.13 $mm^2$ distributed therein. The diameter of the first RF electrode 31 is preferably equal to the diameter of the central portion 32a of the second RF electrode 32, although the difference in diameter therebetween may be within ±10 mm. The plurality of holes 32d all have a hexagonal opening shape and are regularly arranged. The electrode width w between the holes 32d is 3 to 7 mm. A second power supply rod 39 is connected to the second RF electrode 32 via a second terminal 37. The second power supply rod 39 extends through the interior of the shaft 40 and is connected to a second radio-frequency power supply (not shown).

The heater electrode 33 is formed in a single continuous line starting at one end near the center of the ceramic substrate 20, extending substantially throughout the entire ceramic substrate 20, and ending at the other end near the center of the ceramic substrate 20. The heater electrode 33 is preferably made of a refractory conductive material such as molybdenum, tungsten, or niobium. Although not shown, a power supply rod is connected to each end of the heater electrode 33, and each power supply rod extends through the interior of the shaft 40 and is connected to a heater power supply.

The shaft 40 is a cylinder made of the same material as the ceramic substrate 20 and has one end thereof joined to the ceramic substrate 20.

Next, an example of the manufacture of the susceptor 10 having the shaft 40 joined thereto (shaft-equipped susceptor) will be described. A ceramic raw material powder is first prepared as the raw material for the ceramic substrate 20 and is pressed to form first to fourth circular ceramic compacts. The first to fourth ceramic compacts are to be finally laminated to form the ceramic substrate 20. Next, the first RF electrode 31 equipped with the first terminal 36 is placed between the first ceramic compact and the second ceramic compact, the second RF electrode 32 equipped with the second terminal 37 is placed between the second ceramic compact and the third ceramic compact, and the heater electrode 33 is placed between the third ceramic compact and the fourth ceramic compact. These compacts are pressed to form a laminated compact. The laminated compact is then fired by hot pressing to form the ceramic substrate 20. Holes are then formed in the back surface of the ceramic substrate 20 toward the terminals 36 and 37 to expose the terminals 36 and 37 in the holes. The shaft 40 is then joined to the center of the susceptor 10. Joining may be performed by brazing, solid-state bonding (e.g., diffusion bonding), or solid-liquid bonding. Thereafter, the power supply rods 38 and 39 are connected to the terminals 36 and 37, respectively, in the interior of the shaft 40.

Figure 3:
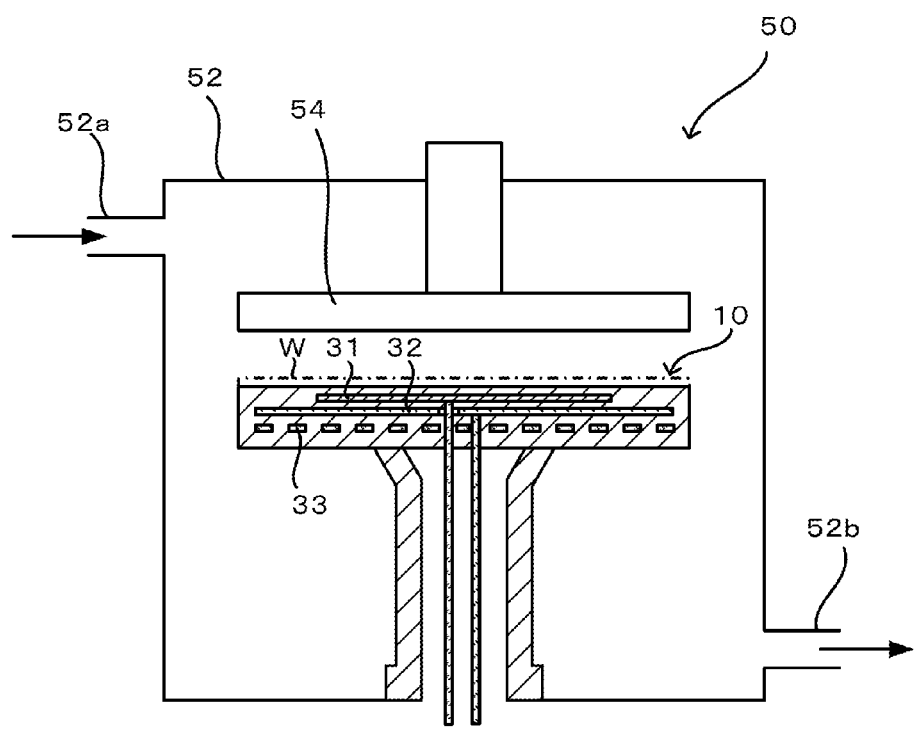
FIG. 3 is a schematic view of a plasma-enhanced chemical vapor deposition apparatus 50 in which the susceptor 10 is installed.

Next, an example of the use of a shaft-equipped susceptor will be described. FIG. 3 is a schematic view of a plasma-enhanced chemical vapor deposition apparatus 50 in which a shaft-equipped susceptor is installed. A shaft-equipped susceptor having a wafer-placing surface 20a on which a wafer W is placed is installed in the interior of a chamber 52 of the plasma-enhanced chemical vapor deposition apparatus 50. Specifically, the end of the shaft 40 is installed on the floor of the chamber 52 in an airtight manner. This isolates the interior of the shaft 40 from the interior of the chamber 52. A counter electrode 54 is disposed on the ceiling of the chamber 52 at a position opposite the susceptor 10. The heater electrode 33 is supplied with electrical power to heat the wafer W placed on the susceptor 10 to a predetermined temperature. At the same time, the interior of the chamber 52 is evacuated to a predetermined degree of vacuum by a vacuum pump connected to a gas outlet 52a of the chamber 52. Thereafter, a source gas for forming a desired film is introduced through a gas inlet 52b of the chamber 52 and is controlled so that the internal pressure of the chamber 52 reaches a predetermined pressure. Different radio-frequency electrical powers are supplied between the first RF electrode 31 and the counter electrode 54 and between the second RF electrode 32 and the counter electrode 54. This generates a plasma between the counter electrode 54 and the susceptor 10, thus forming a desired thin film on the surface of the wafer W.

In the susceptor according to the present invention, the diameter of the first RF electrode in a plan view of the ceramic substrate is preferably within ±10 mm with respect to the diameter of the circular central portion of the second RF electrode in which the plurality of holes are formed. This results in less variation in film thickness after deposition. More preferably, the diameter of the first RF electrode is equal to the diameter of the circular central portion. This results in even less variation in film thickness after deposition.

The above-described susceptor 10 according to this embodiment can be installed in the plasma-enhanced chemical vapor deposition apparatus 50 to provide uniform plasma properties, particularly in the center of the susceptor, thus allowing uniform treatment in the center of the wafer. Unlike the related art, the resulting film has no thickness variation due to transfer of the overlapping portions of the two RF electrodes after deposition. The frequencies and powers of the currents applied to the RF electrodes 31 and 32 can be changed to reduce the variation in film thickness or etching depth in the center and periphery of the wafer or to intentionally make the film thickness smaller or the etching depth greater in either region.

It should be appreciated that the present invention is not limited to the above embodiment, but may be practiced with various embodiments that fall within the technical scope of the present invention.

Figure 4:
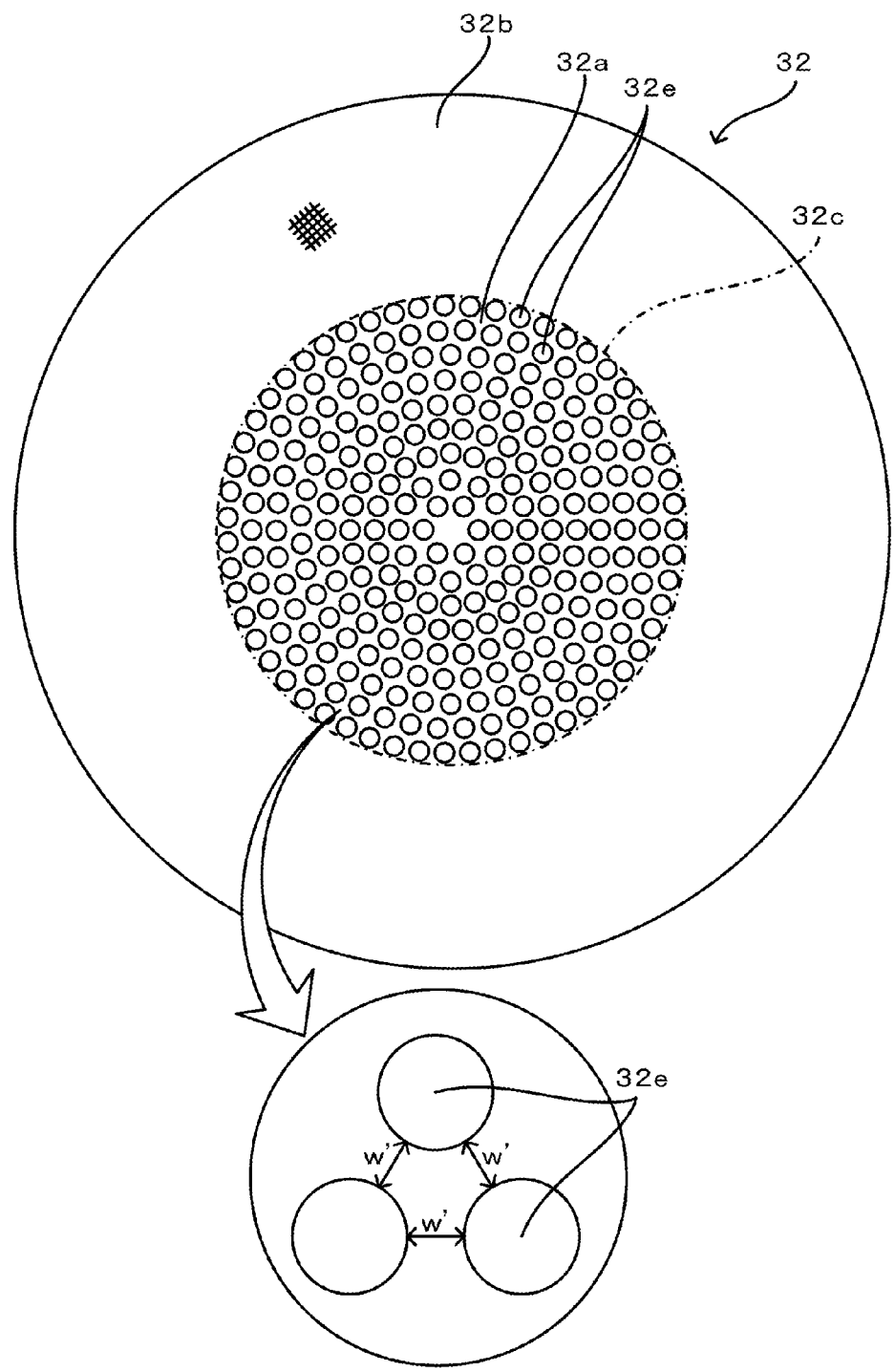
FIG. 4 is a plan view of a second RF electrode 32 according to another embodiment.
Figure 5:
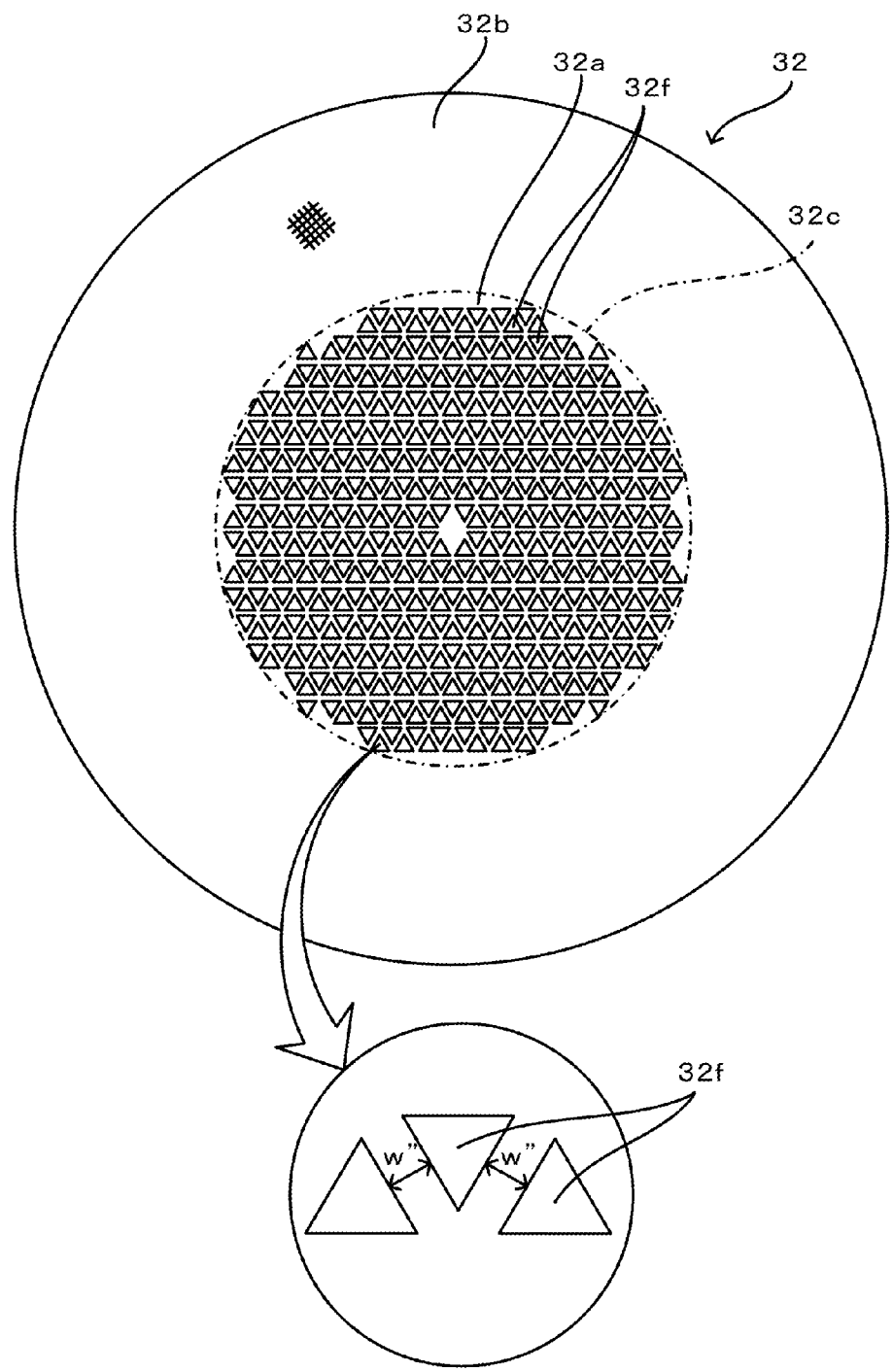
FIG. 5 is a plan view of a second RF electrode 32 according to another embodiment.

For example, although the above embodiment has a plurality of holes having a hexagonal opening shape, the opening shape of the holes is not limited thereto; for example, other embodiments may have holes 32e having a circular opening shape, as shown in FIG. 4, or holes 32f having a triangular opening shape, as shown in FIG. 5. Both the holes 32e and the holes 32f have an opening area of 9.42 to 25.13 mm$^2$ and are regularly arranged. Also, both the electrode width w' between the holes 32e and the electrode width w" between the holes 32f are 3 to 7 mm. However, a hexagonal shape is most effective in reducing the variation in film thickness after deposition, followed by a triangular shape.

Figure 6:
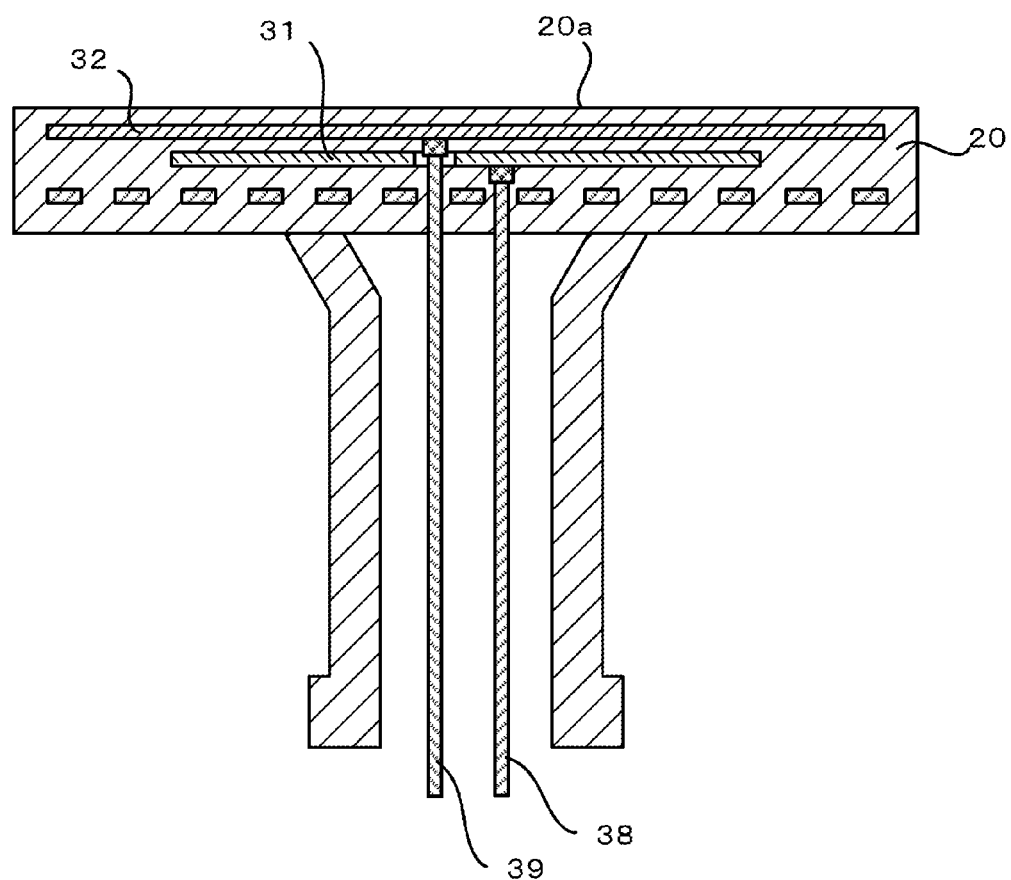
FIG. 6 is a longitudinal sectional view of a susceptor according to another embodiment.

Although the above embodiment includes, in order from the side of the ceramic substrate 20 closer to the wafer-placing surface 20a, the first RF electrode 31 and the second RF electrode 32, other embodiments may include, in order from the side of the ceramic substrate 20 closer to the wafer-placing surface 20a, the second RF electrode 32 and the first RF electrode 31, as shown in FIG. 6. In this case, the second power supply rod 39 extends through the first RF electrode 31 without contact therewith. This provides the same advantage as the above embodiment.

Figure 7:
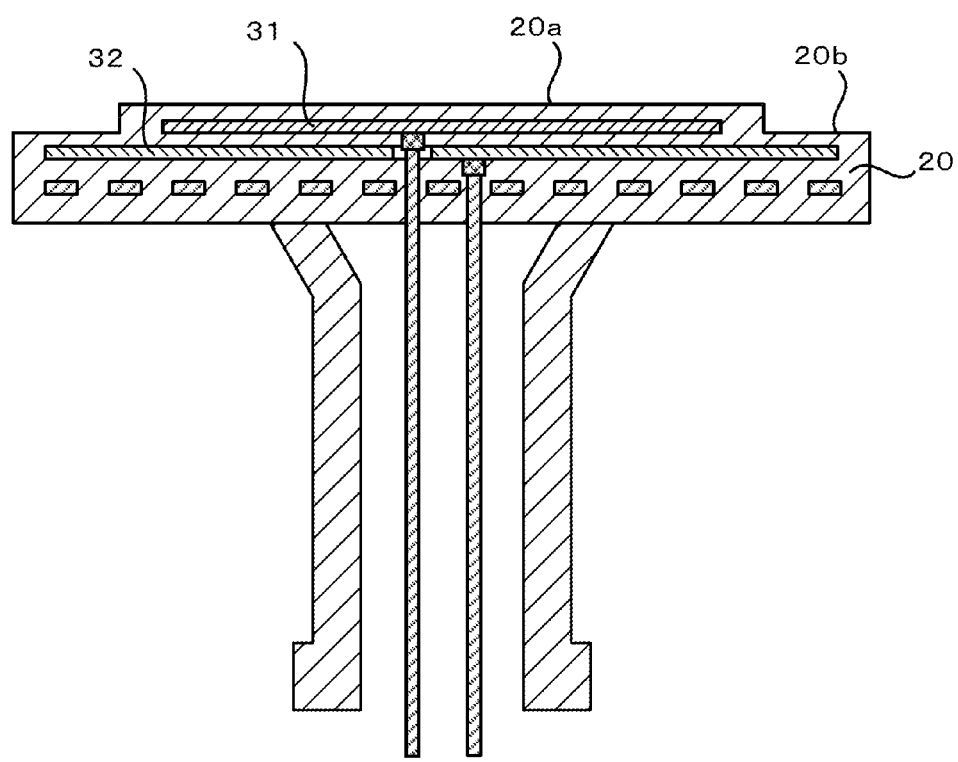
FIG. 7 is a longitudinal sectional view of a susceptor according to another embodiment.
Figure 8:
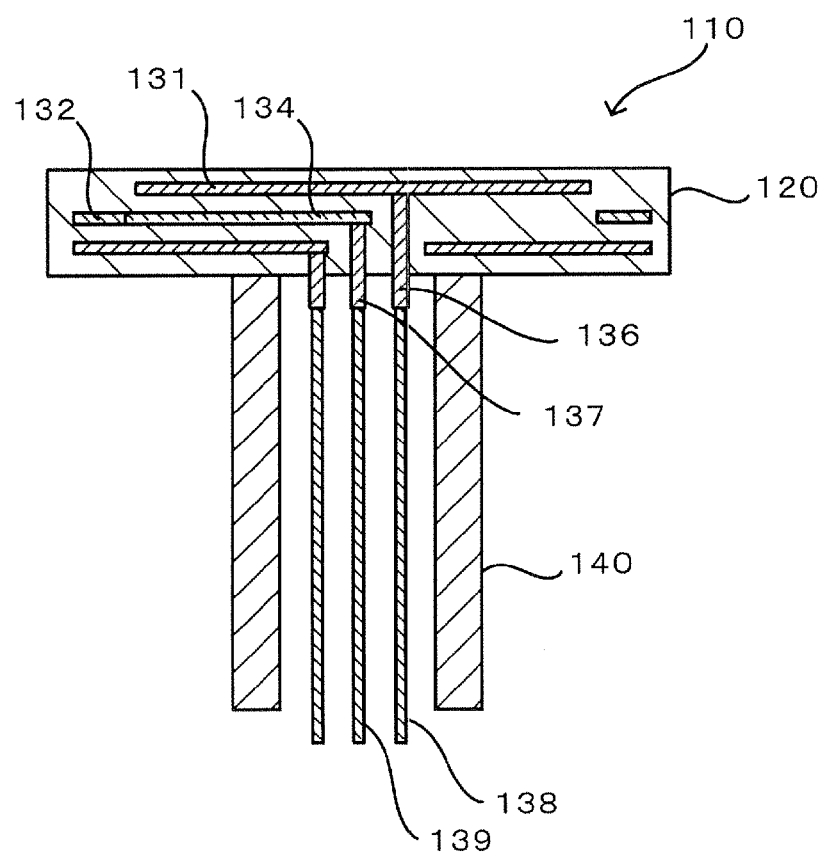
FIG. 8 is a longitudinal sectional view of a susceptor 110 in the related art.
Figure 9:
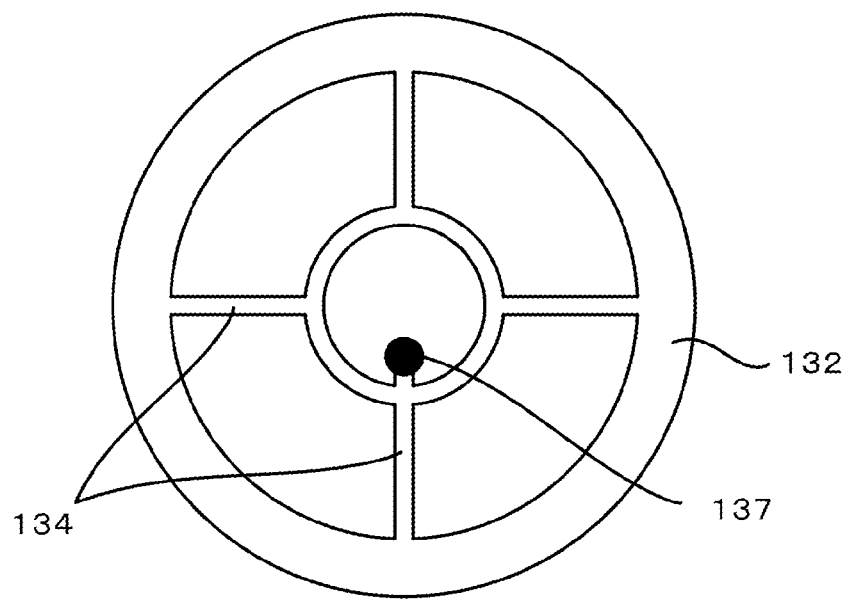
FIG. 9 is a plan view of an annular RF electrode 132 in the related art.

In the above embodiment, as shown in FIG. 7, a step 20b may be formed in the periphery of the wafer-placing surface 20a of the ceramic substrate 20 such that a focus ring (not shown) can be placed thereon. The focus ring is designed to have a surface located at the same height as the wafer-placing surface 20a. Placing the focus ring on the step 20b avoids direct contact of the stepped surface of the ceramic substrate 20 with plasma and thus protects it from plasma. Although the focus ring is degraded by plasma during use, a degraded focus ring may be replaced with a new one. Such a susceptor tends to provide different plasma properties in the periphery and center of the wafer if a single radio-frequency electrical power is applied to a single RF electrode because the focus ring and the ceramic substrate 20 have different dielectric constants and because the ceramic substrate 20 has the step 20b. This often results in uneven film thickness or uneven etching depth over the entire wafer. The susceptor in FIG. 7, however, provides uniform film thickness or uniform etching depth because different radio-frequency electrical powers can be applied to the first RF electrode 31 and the second RF electrode 32.

In the above embodiment, an electrostatic electrode may be buried in the ceramic substrate 20. This allows direct-current electrical power to be applied to the electrostatic electrode to attract the wafer W onto the wafer-placing surface 20a.

EXAMPLES

[Procedure of Manufacturing Shaft-Equipped Susceptor]

An aluminum nitride raw material powder was first prepared as the raw material for the ceramic substrate 20 and was compacted by uniaxial pressing at a pressure of 200 kgf/cm$^2$ to form first to fourth circular ceramic compacts. The first to fourth ceramic compacts are to be finally laminated to form the ceramic substrate 20. Next, a first RF electrode 31 made of a molybdenum mesh and equipped with a first terminal 36 was placed between the first ceramic compact and the second ceramic compact, a second RF electrode 32 made of a molybdenum mesh and equipped with a second terminal 37 was placed between the second ceramic compact and the third ceramic compact, and a heater electrode 33 was placed between the third ceramic compact and the fourth ceramic compact. These compacts were laminated and compacted by uniaxial pressing at a pressure of 200 kgf/cm$^2$ to form a laminated compact. The laminated compact was then fired by hot pressing to form a ceramic substrate 20. Hot pressing was performed at a pressure of 200 kgf/cm$^2$ and a firing temperature of 1,920° C., and the retention time at the firing temperature was 4 hours. The firing atmosphere was a vacuum from room temperature to 1,000° C. and was nitrogen gas at 1.5 kgf/cm$^2$ from 1,000° C. to the hot pressing temperature and during retention at the hot pressing temperature. Holes were then formed in the back surface of the ceramic substrate 20 toward the terminals 36 and 37 to expose the terminals 36 and 37 in the holes. An aluminum nitride shaft 40 was then diffusion-bonded to the center of the back surface of the ceramic substrate 20. Thereafter, power supply rods 38 and 39 were connected to the terminals 36 and 37, respectively, in the interior of the shaft 40. The size of the susceptor 10 was 330 mm in diameter and 15 mm in thickness.

Experimental Examples 1 to 18

Shaft-equipped susceptors including the second RF electrodes 32 shown in Table 1 were fabricated as Experimental Examples 1 to 18. The first RF electrode 31 had a diameter of 155 mm, the entire second RF electrode 32 had a diameter of 315 mm, and the central portion 32a of the second RF electrode 32 had a diameter of 155 mm. The shaft-equipped susceptor of each experimental example was installed in a plasma-enhanced chemical vapor deposition apparatus 50 as shown in FIG. 3. A silicon wafer was placed on the susceptor 10, and a gas mixture of SiH$_4$, O$_2$, N$_2$, and argon was used as a source gas to form a silica film on the silicon wafer. During this process, the first RF electrode was supplied with an electrical power of 800 W at 13.56 MHz, and the second RF electrode 32 was supplied with an electrical power of 400 W at 800 kHz. The deposition process was performed at an atmospheric pressure of 70 Pa and a heater temperature of 510° C. The thickness of the resulting silica film was measured at a plurality of predetermined points on the silicon wafer, and the percentage (%) of the difference between the maximum thickness and the minimum thickness to the maximum thickness was calculated as the thickness variation. A thickness variation of 6% or less was rated as "○", and a thickness variation of more than 6% was rated as "x". The results are summarized in Table 1.

TABLE 1

| | Second RF electrode | | | | |
| --- | --- | --- | --- | --- | --- |
| Experimental example | Opening shape of holes | Opening area of holes(mm$^2$) | Electrode width between holes(mm) | Thickness variation (%) | Evaluation |
| 1 | Circular shape (FIG. 4) | 12.57 | 8 | 15 | x |
| 2 | Hexagonal shape (FIG. 2) | 12.57 | 8 | 13 | x |
| 3 | Triangular shape (FIG. 5) | 12.57 | 8 | 14 | x |
| 4 | Circular shape (FIG. 4) | 12.57 | 7 | 6 | ○ |
| 5 | Hexagonal shape (FIG. 2) | 12.57 | 7 | 4 | ○ |
| 6 | Triangular shape (FIG. 5) | 12.57 | 7 | 5 | ○ |

TABLE 1-continued

| Experimental example | Second RF electrode | | | | |
|---|---|---|---|---|---|
| | Opening shape of holes | Opening area of holes(mm$^2$) | Electrode width between holes(mm) | Thickness variation (%) | Evaluation |
| 7 | Circular shape (FIG. 4) | 12.57 | 6 | 5 | ○ |
| 8 | Hexagonal shape (FIG. 2) | 12.57 | 6 | 3 | ○ |
| 9 | Triangular shape (FIG. 5) | 12.57 | 6 | 4 | ○ |
| 10 | Circular shape (FIG. 4) | 12.57 | 4 | 3 | ○ |
| 11 | Hexagonal shape (FIG. 2) | 12.57 | 4 | 1 | ○ |
| 12 | Triangular shape (FIG. 5) | 12.57 | 4 | 2 | ○ |
| 13 | Circular shape (FIG. 4) | 12.57 | 3 | 4 | ○ |
| 14 | Hexagonal shape (FIG. 2) | 12.57 | 3 | 2 | ○ |
| 15 | Triangular shape (FIG. 5) | 12.57 | 3 | 3 | ○ |
| 16 | Circular shape (FIG. 4) | 12.57 | 2 | 10 | x |
| 17 | Hexagonal shape (FIG. 2) | 12.57 | 2 | 8 | x |
| 18 | Triangular shape (FIG. 5) | 12.57 | 2 | 9 | x |

※thickness variation = (maximum thickness − minimum thickness)/(maximum thickness) × 100(%)

As can be seen from Table 1, the thickness variation was low when the electrode width between the holes was 3 to 7 mm, irrespective of the opening shape of the holes. When the electrode width between the holes was 8 mm, the electrode width between the holes was transferred to the silica film. When the electrode width between the holes was 2 mm, the portion of the electrode between the holes did not function; therefore, the thickness variation was high, as when a large opening is formed in the circular central portion 32a of the second RF electrode 32. The thickness variation was lowest when the holes had a hexagonal opening shape, followed by a triangular shape.

Experimental Examples 19 to 24

Experimental Example 11, which had the lowest thickness variation of Experimental Examples 1 to 18, was further examined for optimization. Specifically, in Experimental Examples 19 to 24, as shown in Table 2, films were deposited as in Experimental Examples 1 to 18 with the electrode width between the holes fixed to 4 mm and the opening area of the holes varied in the range of 6.28 to 28.27 mm$^2$. The results are summarized in Table 2. Experimental Example 21 is the same as Experimental Example 11.

TABLE 2

| Experimental example | Second RF electrode | | | | |
|---|---|---|---|---|---|
| | Opening shape of holes | Opening area of holes(mm$^2$) | Electrode width between holes(mm) | Thickness variation (%) | Evaluation |
| 19 | Hexagonal shape (FIG. 2) | 6.28 | 4 | 20 | x |
| 20 | Hexagonal shape (FIG. 2) | 9.42 | 4 | 5 | ○ |
| 21 | Hexagonal shape (FIG. 2) | 12.57 | 4 | 1 | ○ |
| 22 | Hexagonal shape (FIG. 2) | 21.99 | 4 | 1 | ○ |
| 23 | Hexagonal shape (FIG. 2) | 25.13 | 4 | 2 | ○ |
| 24 | Hexagonal shape (FIG. 2) | 28.27 | 4 | 15 | x |

※thickness variation = (maximum thickness − minimum thickness)/(maximum thickness) × 100(%)

As can be seen from Table 2, the thickness variation was low when the holes had an opening area of 9.42 to 25.13 mm$^2$.

Experimental Examples 25 to 31

In Experimental Examples 25 to 31, as shown in Table 3, films were deposited as in Experimental Examples 1 to 18 with the shape of the holes in the second RF electrode 32 fixed to the conditions of Example 11 and the diameter of the first RF electrode 31 varied in the range of 144 to 166 mm. The results are summarized in Table 3. Experimental Example 28 is the same as Experimental Example 11.

TABLE 3

| Experimental example | Second RF electrode | Diameter of first electrode (mm) | Thickness variation (%) | Evaluation |
|---|---|---|---|---|
| 25 | Opening shape: Hexagonal shape | 144 | 12 | x |
| 26 | Opening area: 12.57 mm$^2$ | 145 | 6 | ○ |
| 27 | Electrode width: 4 mm | 146 | 5 | ○ |

TABLE 3-continued

| Experimental example | Second RF electrode | Diameter of first electrode (mm) | Thickness variation (%) | Evaluation |
|---|---|---|---|---|
| 28 | Diameter of central portion: 155 mm | 155 | 1 | ○ |
| 29 | | 164 | 4 | ○ |
| 30 | | 165 | 5 | ○ |
| 31 | | 166 | 11 | x |

※thickness variation = (maximum thickness − minimum thickness)/(maximum thickness) × 100 (%)

As can be seen from Table 3, the thickness variation was lowest when the diameter of the first RF electrode 31 was equal to the diameter of the central portion 32a of the second RF electrode 32. The thickness variation was 6% or less when the diameter of the first RF electrode 31 was within ±10 mm with respect to the diameter of the central portion 32a of the second RF electrode 32.

Experimental Example 32

Whereas susceptors 10 of the type shown in FIG. 1 were fabricated in Experimental Examples 1 to 31, a susceptor of the type shown in FIG. 6, i.e., a susceptor including, in order from the side closer to the wafer-placing surface 20a, the second RF electrode 32 and the first RF electrode 31 buried therein, was fabricated in Experimental Example 32. The opening shape and area of the holes in the second RF electrode 32 and the electrode width between the holes are as shown in Table 4. In Experimental Example 32, a film was deposited as in Experimental Examples 1 to 18. The results are summarized in Table 4.

TABLE 4

| | Second RF electrode | | | | |
|---|---|---|---|---|---|
| Experimental example | Opening shape of holes | Opening area of holes(mm²) | Electrode width between holes(mm) | Thickness variation (%) | Evaluation |
| 32 | Hexagonal shape (FIG. 2) | 10.39 | 4 | 2 | ○ |

※thickness variation = (maximum thickness − minimum thickness)/(maximum thickness) × 100(%)

As can be seen from Table 4, the thickness variation was low when a susceptor of the type shown in FIG. 6 was used, as when a susceptor 10 of the type shown in FIG. 1 was used.

The present application claims priority from U.S. Provisional Patent Application No. 61/722,900 filed on Nov. 6, 2012, the entire contents of which are incorporated herein by reference.

INDUSTRIAL APPLICABILITY

The present invention is applicable to susceptors for placing of wafers.

REFERENCE SIGNS LIST 10 susceptor, 20 ceramic substrate, 20a wafer-placing surface, 20b step, 31 first circular RF electrode, 32 second circular RF electrode, 32a central portion, 32b peripheral portion, 32c virtual boundary, 32d holes, 32e holes, 32f holes, 33 heater electrode, 36 first terminal, 37 second terminal, 38 first power supply rod, 39 second power supply rod, 40 shaft, 50 plasma-enhanced chemical vapor deposition apparatus, 52 chamber, 52a gas outlet, 52b gas inlet, 54 counter electrode, 110 susceptor, 120 ceramic substrate, 131 circular RF electrode, 132 annular RF electrode, 134 connection circuit, 136 first external terminal, 137 second external terminal, 138 first lead, 139 second lead, 140 support member

The invention claimed is:

1. A susceptor comprising:
   a ceramic disk-shaped plate having a wafer-placing surface;
   a first circular RF electrode buried in the ceramic disk-shaped plate; and
   a second circular RF electrode buried in the ceramic disk-shaped plate at a depth different from the depth of the first RF electrode, wherein, in a plan view of the ceramic disk-shaped plate, the second RF electrode has a larger diameter than the first RF electrode, and
   wherein the second RF electrode has an outer periphery and a circular central portion spaced radially inward from the outer periphery so as to overlap the first RF electrode, the circular central portion having a plurality of holes with a total opening area of 9.42 to 25.13 mm² distributed within the circular central portion in the plan view of the ceramic disk-shaped plate, with an electrode width between each of the plurality of holes being 3 to 7 mm.

2. The susceptor according to claim 1, wherein the plurality of holes all have a same opening shape and are regularly arranged.

3. The susceptor according to claim 1, wherein the plurality of holes have one of a triangular and a hexagonal opening shape.

4. The susceptor according to claim 1, wherein the diameter of the first RF electrode in the plan view of the ceramic disk-shaped plate is within ±10 mm with respect to the diameter of the circular central portion of the second RF electrode in which the plurality of holes are formed.

5. The susceptor according to claim 4, wherein the diameter of the first RF electrode in the plan view of the ceramic disk-shaped plate is equal to the diameter of the circular central portion.

* * * * *